(12) United States Patent
Steudel et al.

(10) Patent No.: US 9,873,831 B2
(45) Date of Patent: Jan. 23, 2018

(54) POLYMER AND ORGANIC LIGHT-EMITTING DEVICE

(71) Applicants: Cambridge Display Technology Limited, Godmanchester (GB); Sumitomo Chemical Company Limited, Tokyo (JP)

(72) Inventors: Annette Steudel, Godmanchester, GA (US); Kiran Kamtekar, Godmanchester (GB)

(73) Assignees: Cambridge Display Technology Limited, Cambridge (GB); Sumitomo Chemical Company Limited, Tokyo (JP)

( * ) Notice: Subject to any disclaimer, the term of this patent is extended or adjusted under 35 U.S.C. 154(b) by 196 days.

(21) Appl. No.: 14/750,536

(22) Filed: Jun. 25, 2015

(65) Prior Publication Data

US 2015/0376495 A1 Dec. 31, 2015

(30) Foreign Application Priority Data

Jun. 27, 2014 (GB) ..................... 1411485

(51) Int. Cl.
*H01L 51/50* (2006.01)
*C09K 11/06* (2006.01)
(Continued)

(52) U.S. Cl.
CPC .............. *C09K 11/06* (2013.01); *C08G 61/12* (2013.01); *C08G 61/122* (2013.01);
(Continued)

(58) Field of Classification Search
None
See application file for complete search history.

(56) References Cited

U.S. PATENT DOCUMENTS

2006/0093852 A1* 5/2006 Marsitzky .............. C08G 61/02
428/690
2011/0272686 A1* 11/2011 Ohuchi .................. C08G 61/10
257/40

FOREIGN PATENT DOCUMENTS

EP 2594607 A1 5/2011
EP 2738195 A1 6/2013

OTHER PUBLICATIONS

Combined Search and Examination Report for Great Britain Application No. GB1411485.4, dated Mar. 31, 2015, pp. 1-5.

* cited by examiner

*Primary Examiner* — Gregory Clark
(74) *Attorney, Agent, or Firm* — Wolf, Greenfield & Sacks, P.C.

(57) ABSTRACT

A co-polymer comprising a repeat unit of formula (I):

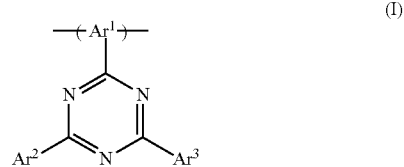

wherein $Ar^1$, $Ar^2$ and $Ar^3$ each independently represent an aryl or heteroaryl group that may be unsubstituted or substituted with one or more substituents, the copolymer further comprising a conjugation-breaking repeat unit that does not provide any conjugation path between repeat units adjacent to the conjugation-breaking repeat unit. The copolymer may be used as a host material of a phosphorescent material in a light-emitting layer of an organic light-emitting device.

17 Claims, 1 Drawing Sheet

(51) Int. Cl.
    *C09K 11/02*     (2006.01)
    *C08G 73/06*     (2006.01)
    *H01L 51/00*     (2006.01)
    *C08G 61/12*     (2006.01)
    *C09D 165/00*     (2006.01)
    *C09D 179/04*     (2006.01)
    *C08K 5/00*     (2006.01)

(52) U.S. Cl.
    CPC ........ *C08G 73/0644* (2013.01); *C08K 5/0091* (2013.01); *C09D 165/00* (2013.01); *C09D 179/04* (2013.01); *C09K 11/025* (2013.01); *H01L 51/0043* (2013.01); *C08G 2261/149* (2013.01); *C08G 2261/1412* (2013.01); *C08G 2261/19* (2013.01); *C08G 2261/312* (2013.01); *C08G 2261/3142* (2013.01); *C08G 2261/3221* (2013.01); *C08G 2261/3424* (2013.01); *C08G 2261/364* (2013.01); *C08G 2261/411* (2013.01); *C08G 2261/5242* (2013.01); *C08G 2261/95* (2013.01); *C09K 2211/1011* (2013.01); *C09K 2211/1059* (2013.01); *C09K 2211/185* (2013.01); *H01L 51/0085* (2013.01); *H01L 51/5012* (2013.01)

POLYMER AND ORGANIC LIGHT-EMITTING DEVICE

RELATED APPLICATIONS

This application claims foreign priority benefits under 35 U.S.C. §119(a)-(d) or 35 U.S.C. §365(b) of British application number 1411485.4, filed Jun. 27, 2014, the entirety of which is herein incorporated by reference.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

Phosphorescent dopants are also known (that is, a light-emitting dopant in which light is emitted via decay of a triplet exciton).

A hole-transporting layer may be provided between the anode and light-emitting layer of an OLED.

Suitable light-emitting materials include small molecule, polymeric and dendrimeric materials. Suitable light-emitting polymers include poly(arylene vinylenes) such as poly (p-phenylene vinylenes) and polymers containing arylene repeat units, such as fluorene repeat units. Blue light-emitting fluorene homopolymer is disclosed in WO 97/05184.

WO 2010/085676 discloses host materials for electro-phosphorescent devices. A copolymer formed by copolymerization of 1,6-bis(3-(4,4,5,5-tetramethyl-[1,3,2]-dioxaborolan-2-yl)phenoxyl)hexane and 2-(4-(3-(3,6-dibromocarbazol-9-yl)propyl)phenyl)-4,6-di(3-methylphenyl)-1,3,5-triazine is disclosed.

WO 2008/025997 discloses the following monomer for use in preparation of a polymeric host:

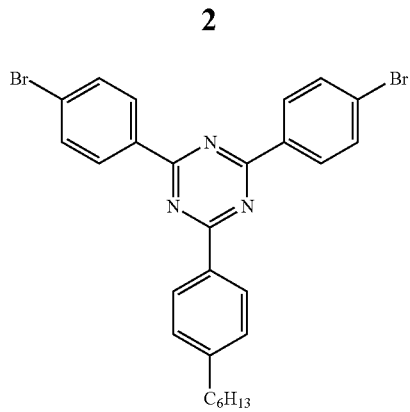

JP 2006/096803 discloses arylene ether polymers having formula (I) that may be used with phosphorescent compounds:

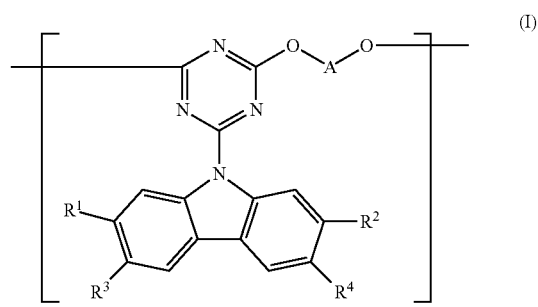

In which $R^1$-$R^4$ may be H, F or an organic group.

Group A of formula (I) may have the following structure:

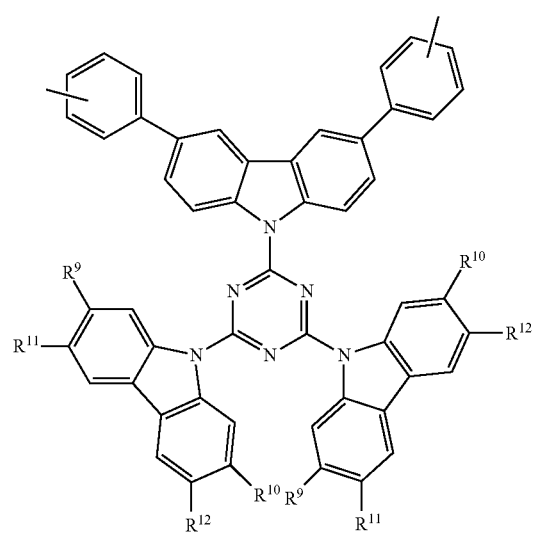

in which $R^9$-$R^{12}$ may be H, F or an organic group.

EP 2594607 discloses a composition comprising a polymer compound and a phosphorescent light-emitting compound where the polymer consists of units selected from units (1)-1, (1)-2, (2)-1 and (2)-2:

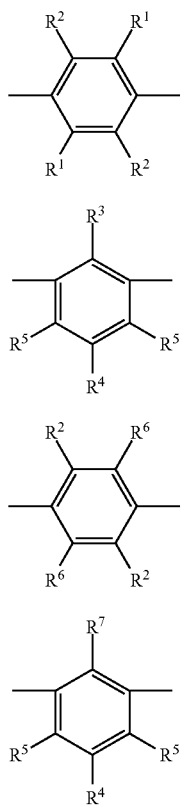

(1)-1

(1)-2

(2)-1

(2)-2

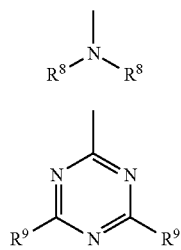

wherein R4 may be a group represented by Formula (3) and/or a group represented by formula (4):

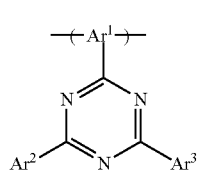

(3)

(4)

SUMMARY OF THE INVENTION

In a first aspect the invention provides a co-polymer comprising a repeat unit of formula (I):

$$\text{---}(Ar^1)\text{---}$$ (I)

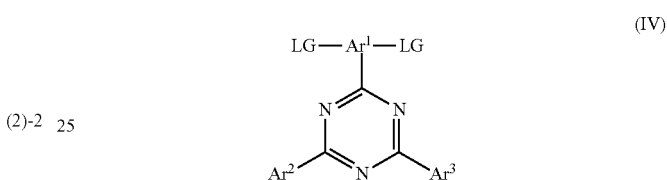

wherein $Ar^1$, $Ar^2$ and $Ar^3$ each independently represent an aryl or heteroaryl group that may be unsubstituted or substituted with one or more substituents, the copolymer further comprising a conjugation-breaking repeat unit that does not provide any conjugation path between repeat units adjacent to the conjugation-breaking repeat unit.

In a second aspect the invention provides a composition comprising a polymer according to the first aspect and a light-emitting material.

In a third aspect the invention provides a formulation comprising a polymer according to the first aspect or a composition according to the second aspect and at least one solvent.

In a fourth aspect the invention provides an organic light-emitting device comprising an anode, a cathode and a light-emitting layer between the anode and cathode wherein the light-emitting layer comprises a composition according to the second aspect.

In a fifth aspect the invention provides a method of forming a polymer according to the first aspect comprising the step of polymerising a monomer of formula (IV):

$$\text{LG}\text{---}Ar^1\text{---}\text{LG}$$ (IV)

wherein LG is a leaving group capable of leaving in a coupling reaction to form a carbon-carbon bond with an aromatic or heteroaromatic group; $Ar^1$, $A^2$ and $Ar^3$ are as described with reference to the first aspect; and wherein the monomer of formula (IV) is copolymerized with a monomer for forming the conjugation-breaking repeat unit.

DESCRIPTION OF THE DRAWINGS

The invention will now be described in more detail with reference to the drawings in which.

DETAILED DESCRIPTION OF THE INVENTION

Figure 1:
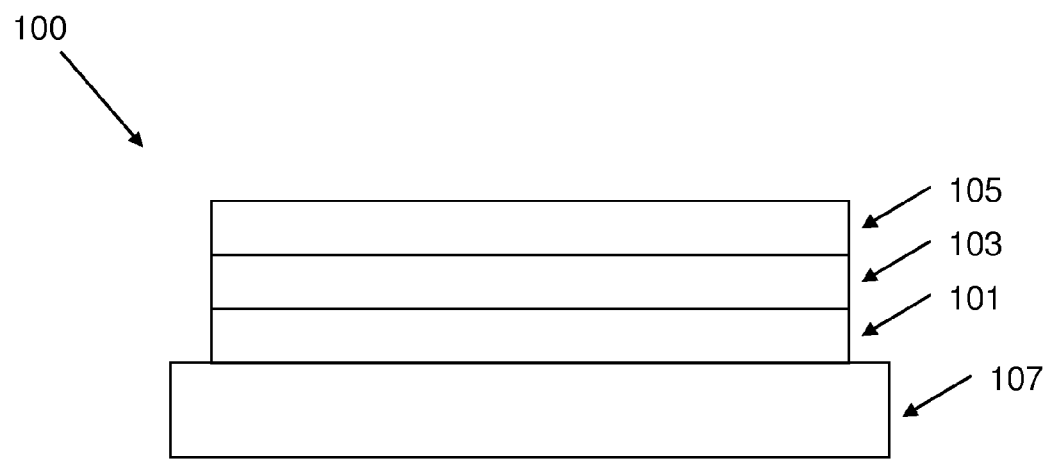
FIG. 1 illustrates schematically an OLED according to an embodiment of the invention.

FIG. 1 illustrates an OLED 100 according to an embodiment of the invention comprising an anode 101, a cathode 105 and a light-emitting layer 103 between the anode and cathode. The device 100 is supported on a substrate 107, for example a glass or plastic substrate.

One or more further layers may be provided between the anode 101 and cathode 105, for example hole-transporting layers, electron transporting layers, hole blocking layers and electron blocking layers. The device may contain more than one light-emitting layer.

Preferred device structures include:
Anode/Hole-injection layer/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

Preferably, at least one of a hole-transporting layer and hole injection layer is present.

Preferably, both a hole injection layer and hole-transporting layer are present.

Light-emitting materials include red, green and blue light-emitting materials.

A blue emitting material may have a photoluminescent spectrum with a peak in the range of no more than 490 nm, optionally in the range of 420-480 nm.

A green emitting material may have a photoluminescent spectrum with a peak in the range of more than 490 nm up to 580 nm, optionally more than 490 nm up to 540 nm.

A red emitting material may optionally have a peak in its photoluminescent spectrum of more than 580 nm up to 630 nm, optionally 585-625 nm.

The photoluminescence spectrum of a light-emitting material as described herein may be measured by casting 5 wt % of the material in a PMMA film onto a quartz substrate to achieve transmittance values of 0.3-0.4 and measuring in a nitrogen environment using apparatus C9920-02 supplied by Hamamatsu.

Light-emitting layer 103 contains a polymer of the invention and one or more phosphorescent materials, to form a host-dopant system. The light-emitting layer 103 may consist essentially of these materials or may contain one or more further materials, for example one or more charge-transporting materials or one or more further light-emitting materials. The triplet energy level of the host polymer is preferably no more than 0.1 eV below that of the light-emitting material, and is more preferably about the same or higher than that of the light-emitting material in order to avoid quenching of phosphorescence from the light-emitting dopant. Optionally, the lowest triplet energy level of the host polymer is at least at least 2.4 or at least 2.6 eV. The triplet energy level of the host polymer may be selected according to the shortest wavelength phosphorescent material used with the host. For example, if a green phosphorescent material is the shortest wavelength material then the triplet energy level of the host material may be lower than that of a host for a blue phosphorescent material.

In a preferred embodiment, light-emitting layer 103 contains a composition and a polymer of the invention and at least one of green and blue phosphorescent light-emitting materials.

If present, a charge-transporting layer adjacent to a phosphorescent light-emitting layer preferably contains a charge-transporting material having a $T_1$ excited state energy level that is no more than 0.1 eV lower than, preferably the same as or higher than, the $T_1$ excited state energy level of the phosphorescent light-emitting material(s) of the invention in order to avoid quenching of triplet excitons migrating from the light-emitting layer into the charge-transporting layer.

Triplet energy levels of a host material may be measured from the energy onset (energy at half of the peak intensity on the high energy side) of the phosphorescence spectrum measured by low temperature phosphorescence spectroscopy (Y. V. Romaovskii et al, Physical Review Letters, 2000, 85 (5), p1027, A. van Dijken et al, Journal of the American Chemical Society, 2004, 126, p7718).

Triplet energy level of a phosphorescent material may be measured from its phosphorescence spectrum.

Optionally, $Ar^1$ of formula (I) is phenylene, as illustrated in formula (Ia):

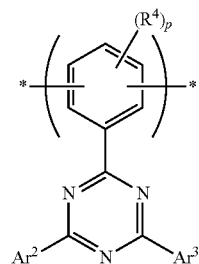

(Ia)

wherein $Ar^2$ and $Ar^3$ are as described above, $R^4$ is a substituent and p is 0, 1, 2 or 3.

Exemplary substituents $R^4$, where present, are $C_{1-20}$ alkyl wherein one or more non-adjacent C atoms of the alkyl group may be replaced by O, S or COO, C=O, $NR^6$ or $SiR^6_2$ and one or more H atoms of the $C_{1-20}$ alkyl group may be replaced by F wherein $R^6$ is a substituent and is optionally in each occurrence a $C_{1-40}$ hydrocarbyl group, optionally a $C_{1-20}$ alkyl group.

Optionally, $Ar^1$ is 1,3-linked phenylene. The extent of conjugation across the 1,3-linked phenylene group in the polymer backbone is limited as compared to the extent of conjugation across a 1,4-linked phenylene unit in the polymer backbone.

Optionally, $Ar^2$ is phenyl.
Optionally, $Ar^3$ is phenyl.
Optionally, the repeat unit of formula (I) has formula (Ib):

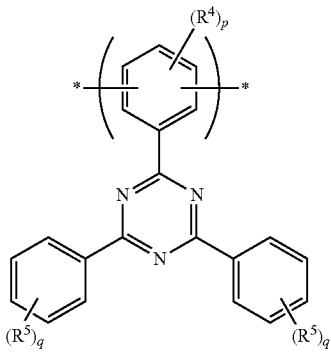

wherein $R^4$ and p are as described above; $R^5$ is a substituent; and q independently in each occurrence is 0, 1, 2, 3 or 4.

Where present, each $R^5$ may independently be a $C_{1-40}$ hydrocarbyl.

Exemplary $C_{1-40}$ hydrocarbyl groups include alkyl; aryl, preferably phenyl; or a linear or branched chain of aryl groups, preferably a linear or branched chain of phenyl groups, that may be unsubstituted or substituted with one or more substituents. Exemplary hydrocarbyl substituents include the following:

$C_{1-20}$ alkyl;

phenyl substituted with one or more $C_{1-20}$ alkyl groups; and a branched or linear chain of two or more phenyl rings, each of which ring may be substituted with one or more $C_{1-20}$ alkyl groups, for example biphenyl or 3,5-diphenylbenzene.

Exemplary aromatic hydrocarbyl groups include the following, each of which may be substituted with one or more substituents:

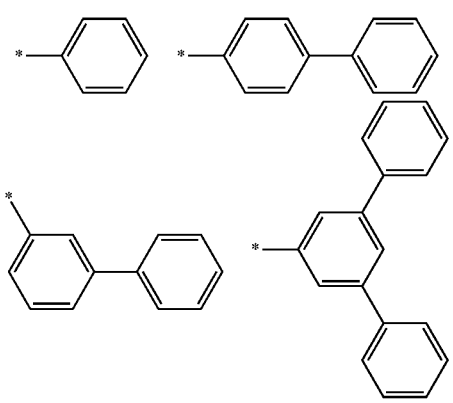

One or more non-adjacent C atoms of a $C_{1-20}$ alkyl group $R^5$ may independently be replaced with O, S or COO, C=O, $NR^6$ or $SiR^6{}_2$ and one or more H atoms of the $C_{1-20}$ alkyl group may be replaced by F wherein $R^6$ is a substituent and is optionally in each occurrence a $C_{1-40}$ hydrocarbyl group, optionally a $C_{1-20}$ alkyl group.

Alkyl groups as described anywhere herein includes linear, branched and cyclic alkyl groups.

Exemplary repeat units of formula (I) include the following:

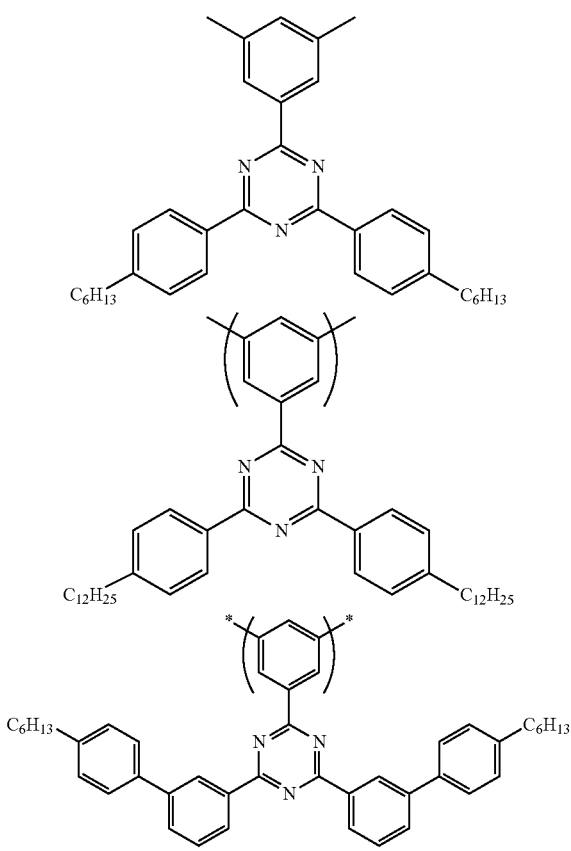

Repeat units of formula (I) may be provided in an amount in the range of 1-99 mol % of the copolymer, more preferably 20-50 mol %.

The polymer may comprise one repeat unit of formula (I), or two or more different repeat units of formula (I).

The polymer comprising repeat units of formula (I) is a co-polymer comprising repeat units of formula (I) and a conjugation-breaking repeat unit, which is a repeat unit that does not provide any conjugation path between repeat units adjacent to the conjugation-breaking repeat unit. The conjugation-breaking repeat unit is preferably provided in an amount in the range of 1-50 mol % of the copolymer, more preferably 20-50 mol %.

The polymer may comprise one conjugation-breaking repeat unit, or two or more different conjugation-breaking repeat units.

Exemplary conjugation-breaking co-repeat units include co-repeat units of formula (II):

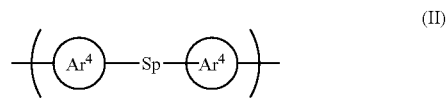

(II)

wherein:

$Ar^4$ in each occurrence independently represents an aryl or heteroaryl group that may be unsubstituted or substituted with one or more substituents; and Sp represents a spacer group comprising at least one carbon or silicon atom.

Preferably, the spacer group includes at least one $sp^3$-hybridised carbon atom separating the $Ar^4$ groups.

Preferably $Ar^4$ is an aryl group and the $Ar^4$ groups may be the same or different. More preferably each $Ar^4$ is phenyl.

Each $Ar^4$ may independently be unsubstituted or may be substituted with 1, 2, 3 or 4 substituents. The one or more substituents may be selected from substituents $R^5$ described above, optionally with one or more $C_{1-20}$ alkyl groups, which may be the same or different in each occurrence.

Exemplary groups Sp include a $C_{1-20}$ alkyl chain wherein one or more non-adjacent C atoms of the chain may be replaced with O, S, $—NR^6—$, $—SiR^6{}_2—$, $—C(=O)—$ or $—COO—$ and wherein $R^6$ in each occurrence is as described above.

Exemplary repeat units of formula (II) include the following, wherein R in each occurrence is H or $C_{1-5}$ alkyl:

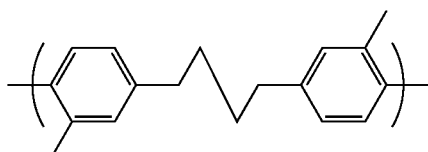

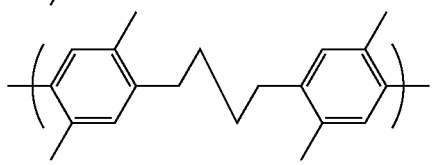

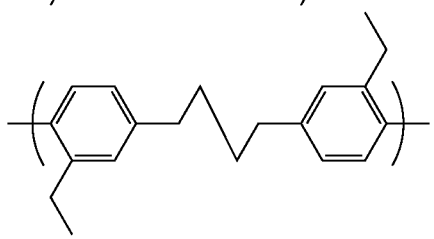

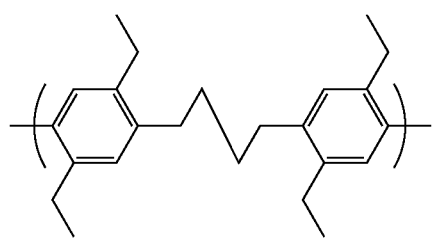
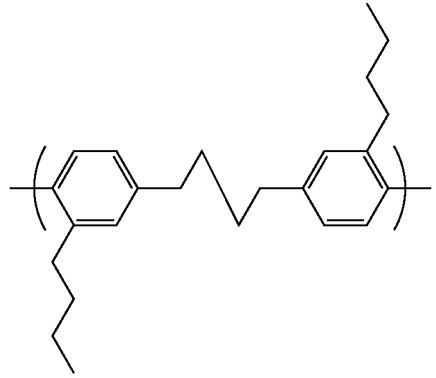
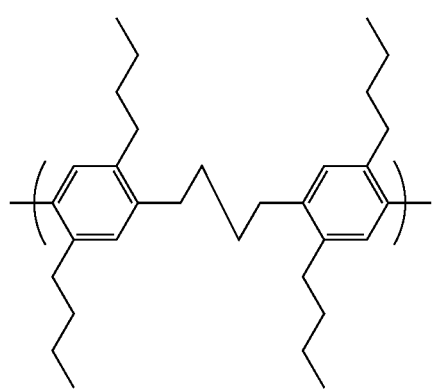
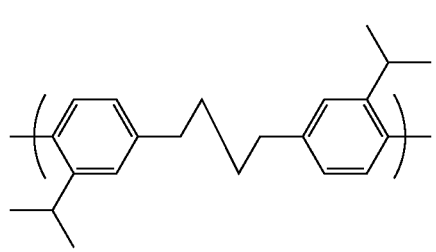
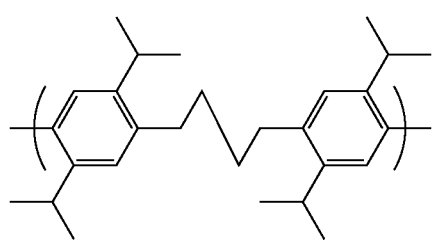
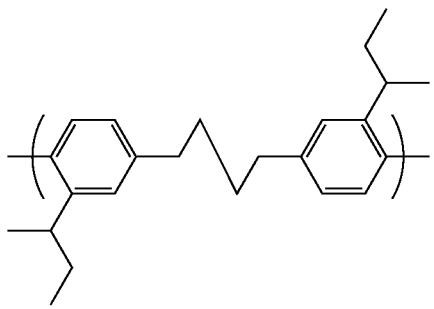
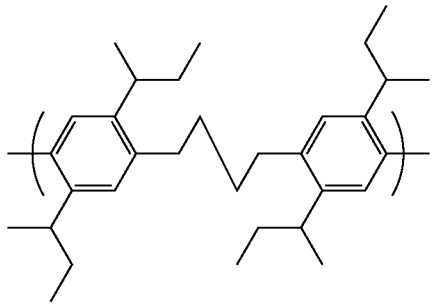
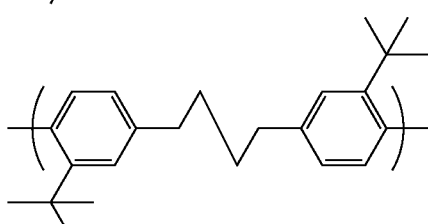
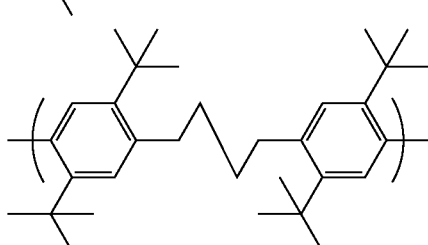
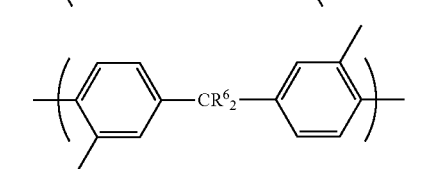
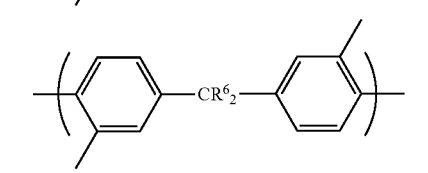
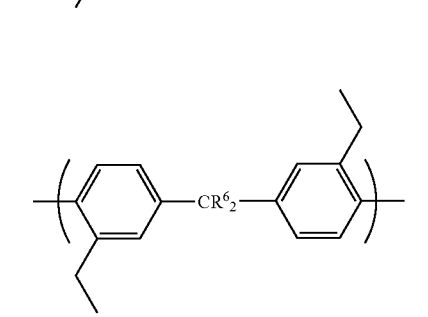

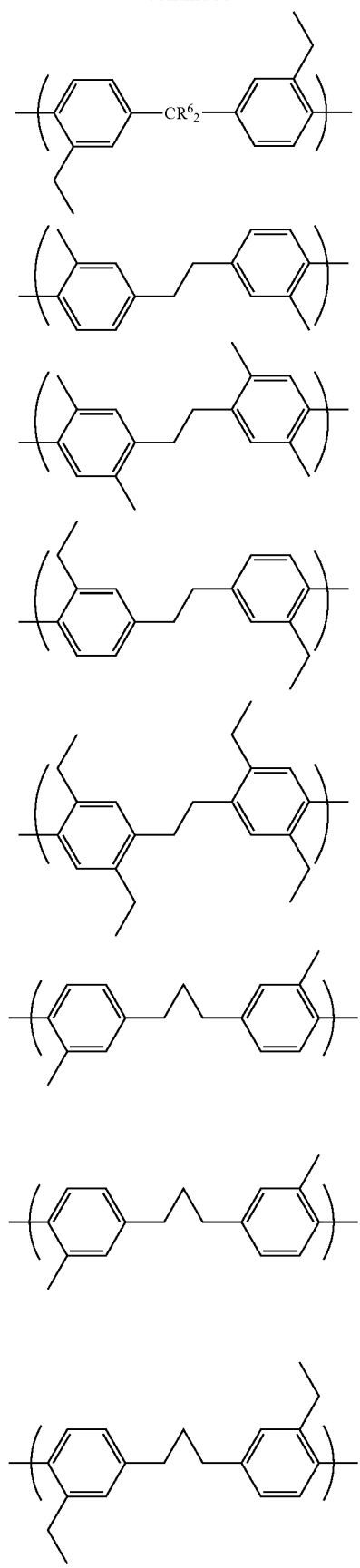
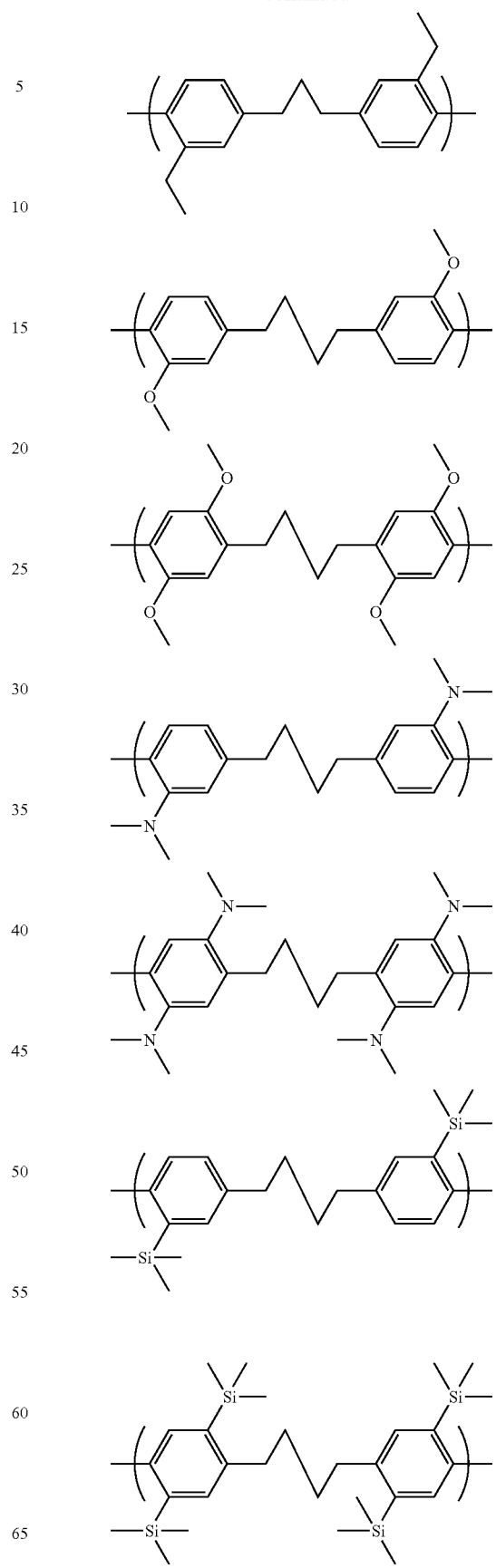

-continued

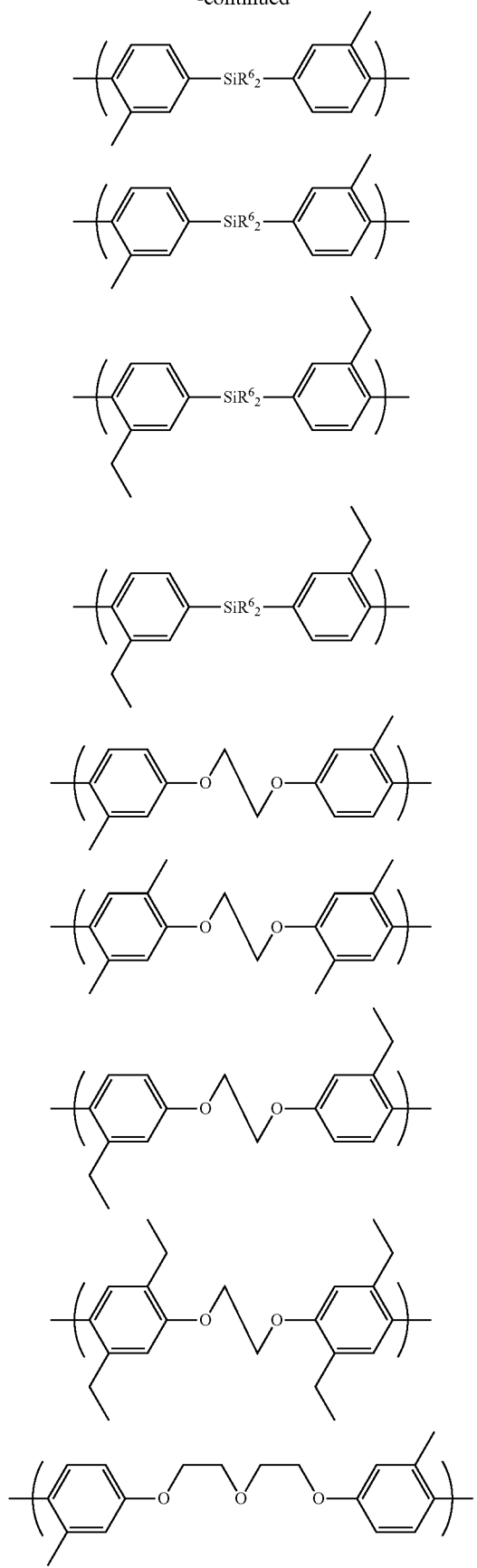

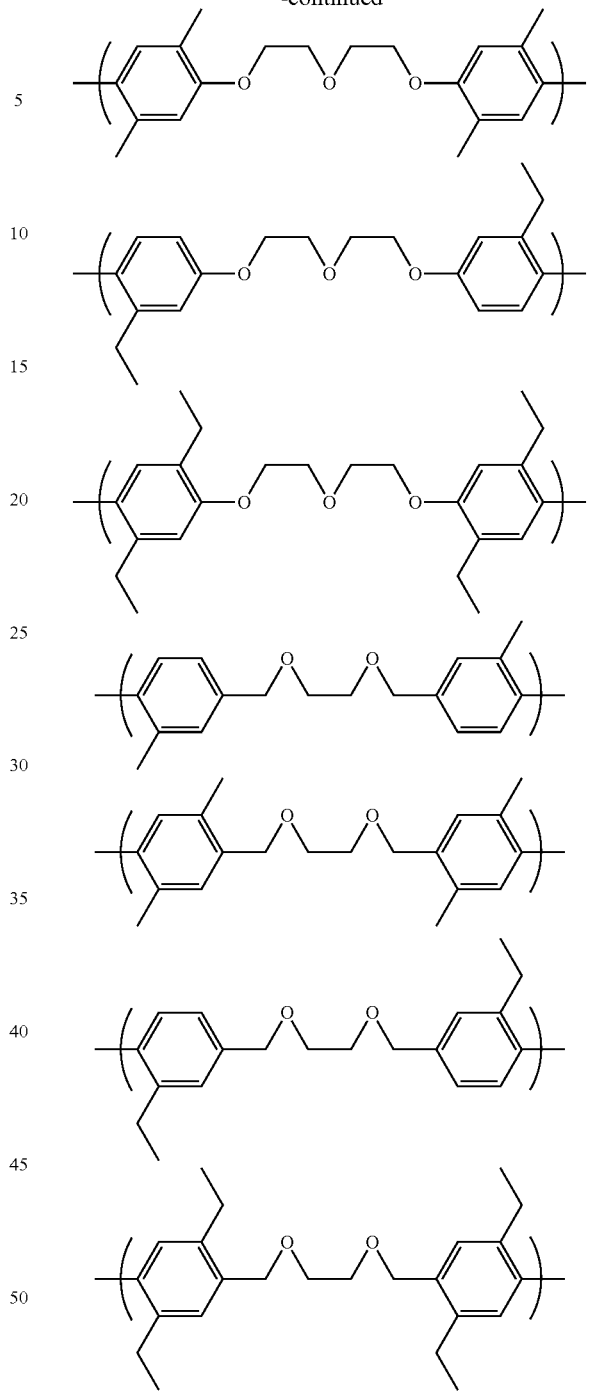

The polymer may further comprise arylene co-repeat units that may be unsubstituted or substituted with one or more substituents.

Exemplary arylene co-repeat units include 1,2-, 1,3- and 1,4-phenylene repeat units, 3,6- and 2,7-linked fluorene repeat units, indenofluorene, naphthalene, anthracene and phenanthrene repeat units, each of which may be unsubstituted or substituted with one or more substitutents, for example one or more $C_{1-40}$ hydrocarbyl substituents.

One preferred class of arylene repeat units is phenylene repeat units, such as phenylene repeat units of formula (VI):

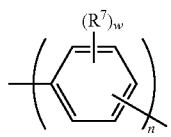

(VI)

wherein w in each occurrence is independently 0, 1, 2, 3 or 4, optionally 1 or 2; n is 1, 2 or 3; and $R^7$ independently in each occurrence is a substituent.

Where present, each $R^7$ may independently be selected from the group consisting of:
- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- aryl and heteroaryl groups that may be unsubstituted or substituted with one or more substituents, preferably phenyl substituted with one or more $C_{1-20}$ alkyl groups;
- a linear or branched chain of aryl or heteroaryl groups, each of which groups may independently be substituted, for example a group of formula $—(Ar^7)_r$ wherein each $Ar^7$ is independently an aryl or heteroaryl group and r is at least 2, preferably a branched or linear chain of phenyl groups each of which may be unsubstituted or substituted with one or more $C_{1-20}$ alkyl groups; and
- a crosslinkable-group, for example a group comprising a double bond such and a vinyl or acrylate group, or a benzocyclobutane group.

In the case where $R^7$ comprises an aryl or heteroaryl group, or a linear or branched chain of aryl or heteroaryl groups, the or each aryl or heteroaryl group may be substituted with one or more substituents $R^8$ selected from the group consisting of:
- alkyl, for example $C_{1-20}$ alkyl, wherein one or more non-adjacent C atoms may be replaced with O, S, substituted N, C=O and —COO— and one or more H atoms of the alkyl group may be replaced with F;
- $NR^9_2$, $OR^9$, $SR^9$, $SiR^9_3$ and fluorine, nitro and cyano;

wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^6$— wherein $R^6$ is as described above.

Preferably, each $R^7$, where present, is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

If n is 1 then exemplary repeat units of formula (VI) include the following:

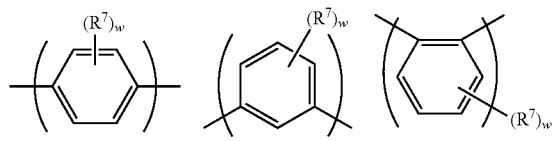

A particularly preferred repeat unit of formula (VI) has formula (VIa):

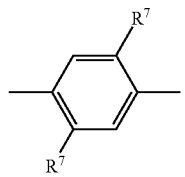

(VIa)

Substituents $R^7$ of formula (VIa) are adjacent to linking positions of the repeat unit, which may cause steric hindrance between the repeat unit of formula (VIa) and adjacent repeat units, resulting in the repeat unit of formula (VIa) twisting out of plane relative to one or both adjacent repeat units.

Exemplary repeat units where n is 2 or 3 include the following:

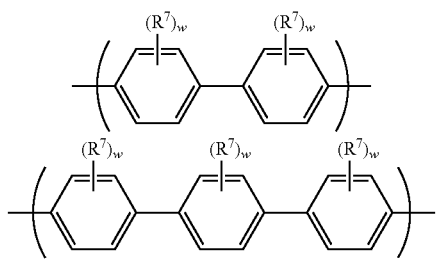

A preferred repeat unit has formula (VIb):

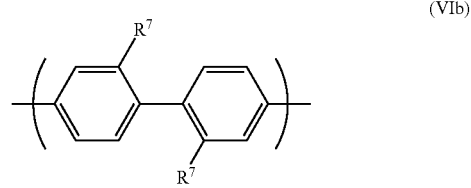

(VIb)

The two $R^7$ groups of formula (VIb) may cause steric hindrance between the phenyl rings they are bound to, resulting in twisting of the two phenyl rings relative to one another.

A further class of arylene repeat units are optionally substituted fluorene repeat units, such as repeat units of formula (VII):

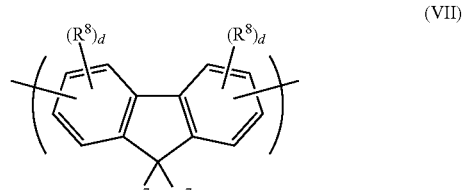

(VII)

wherein $R^7$ in each occurrence is the same or different and is a substituent as described with reference to formula (VI), and wherein the two groups $R^7$ may be linked to form a ring; $R^8$ is a substituent; and d is 0, 1, 2 or 3.

The aromatic carbon atoms of the fluorene repeat unit may be unsubstituted, or may be substituted with one or more substituents R⁸. Exemplary substituents R⁸ are alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

Substituted N, where present, may be —NR⁶— wherein R⁶ is as described above.

The extent of conjugation of repeat units of formula (VII) to aryl or heteroaryl groups of adjacent repeat units in the polymer backbone may be controlled by (a) linking the repeat unit through the 3- and/or 6-positions to limit the extent of conjugation across the repeat unit, and/or (b) substituting the repeat unit with one or more substituents R⁸ in or more positions adjacent to the linking positions in order to create a twist with the adjacent repeat unit or units, for example a 2,7-linked fluorene carrying a $C_{1-20}$ alkyl substituent in one or both of the 3- and 6-positions.

The repeat unit of formula (VII) may be an optionally substituted 2,7-linked repeat unit of formula (VIIa):

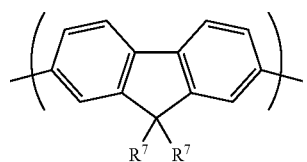

(VIIa)

Optionally, the repeat unit of formula (VIIa) is not substituted in a position adjacent to the 2- or 7-position. Linkage through the 2- and 7-positions and absence of substituents adjacent to these linking positions provides a repeat unit that is capable of providing a relatively high degree of conjugation across the repeat unit.

The repeat unit of formula (VII) may be an optionally substituted 3,6-linked repeat unit of formula (VIIb)

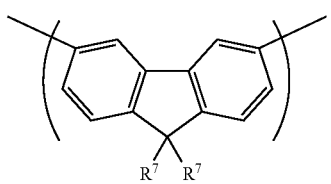

(VIIb)

The extent of conjugation across a repeat unit of formula (VIIb) may be relatively low as compared to a repeat unit of formula (VIIa).

Another exemplary arylene repeat unit has formula (VIII):

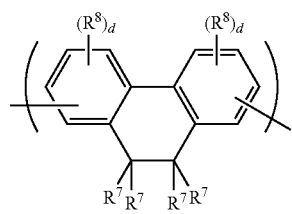

(VIII)

wherein R⁷, R⁸ and d are as described with reference to formula (VI) and (VII) above. Any of the R⁷ groups may be linked to any other of the R⁷ groups to form a ring. The ring so formed may be unsubstituted or may be substituted with one or more substituents, optionally one or more $C_{1-20}$ alkyl groups.

Repeat units of formula (VIII) may have formula (VIIIa) or (VIIIb):

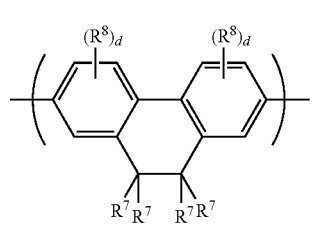

(VIIIa)

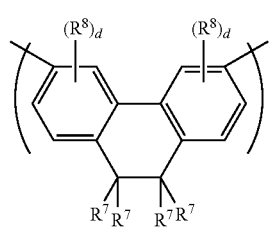

(VIIIb)

Further arylene co-repeat units include: phenanthrene repeat units; naphthalene repeat units; anthracene repeat units; and perylene repeat units. Each of these arylene repeat units may be linked to adjacent repeat units through any two of the aromatic carbon atoms of these units. Specific exemplary linkages include 9,10-anthracene; 2,6-anthracene; 1,4-naphthalene; 2,6-naphthalene; 2,7-phenanthrene; and 2,5-perylene. Each of these repeat units may be substituted or unsubstituted, for example substituted with one or more $C_{1-40}$ hydrocarbyl groups.

The polymer may contain one or more hole transporting repeat units. Exemplary hole transporting repeat units may be repeat units of materials having a electron affinity of 2.9 eV or lower and an ionisation potential of 5.8 eV or lower, preferably 5.7 eV or lower.

Preferred hole-transporting repeat units are (hetero) arylamine repeat units, including repeat units of formula (IX):

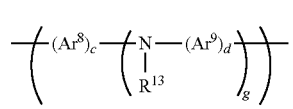

(IX)

wherein Ar⁸ and Ar⁹ in each occurrence are independently selected from substituted or unsubstituted aryl or heteroaryl, g is greater than or equal to 1, preferably 1 or 2, R¹³ is H or a substituent, preferably a substituent, and c and d are each independently 1, 2 or 3.

R¹³, which may be the same or different in each occurrence when g>1, is preferably selected from the group consisting of alkyl, for example $C_{1-20}$ alkyl, Ar¹⁰, a branched or linear chain of Ar¹⁰ groups, or a crosslinkable unit that is bound directly to the N atom of formula (IX) or spaced apart therefrom by a spacer group, wherein Ar¹⁰ in each occurrence is independently optionally substituted aryl or heteroaryl. Exemplary spacer groups are $C_{1-20}$ alkyl, phenyl and phenyl-$C_{1-20}$ alkyl.

Any of $Ar^8$, $Ar^9$ and, if present, $Ar^{10}$ in the repeat unit of Formula (IX) may be linked by a direct bond or a divalent linking atom or group to another of $Ar^8$, $Ar^9$ and $Ar^{10}$. Preferred divalent linking atoms and groups include O, S; substituted N; and substituted C.

Any of $Ar^8$, $Ar^9$ and, if present, $Ar^{10}$ may be substituted with one or more substituents. Exemplary substituents are substituents $R^{10}$, wherein each $R^{10}$ may independently be selected from the group consisting of:

substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and a crosslinkable group attached directly to the fluorene unit or spaced apart therefrom by a spacer group, for example a group comprising a double bond such and a vinyl or acrylate group, or a benzocyclobutane group Preferred repeat units of formula (IX) have formulae 1-3:

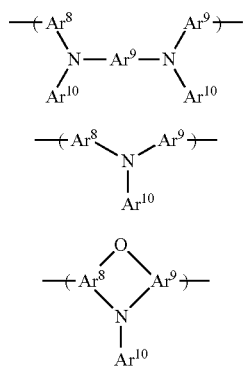

In one preferred arrangement, $R^{13}$ is $Ar^{10}$ and each of $Ar^8$, $Ar^9$ and $Ar^{10}$ are independently and optionally substituted with one or more $C_{1-20}$ alkyl groups. $Ar^8$, $Ar^9$ and $Ar^{10}$ are preferably phenyl.

In another preferred arrangement, the central $Ar^9$ group of formula (IX) linked to two N atoms is a polycyclic aromatic that may be unsubstituted or substituted with one or more substituents $R^{10}$. Exemplary polycyclic aromatic groups are naphthalene, perylene, anthracene and fluorene.

In another preferred arrangement, $Ar^8$ and $Ar^9$ are phenyl, each of which may be substituted with one or more $C_{1-20}$ alkyl groups, and $R^{13}$ is —$(Ar^{10})_r$ wherein r is at least 2 and wherein the group —$(Ar^{10})_r$ forms a linear or branched chain of aromatic or heteroaromatic groups, for example 3,5-diphenylbenzene wherein each phenyl may be substituted with one or more $C_{1-20}$ alkyl groups. In another preferred arrangement, c, d and g are each 1 and $Ar^8$ and $Ar^9$ are phenyl linked by an oxygen atom to form a phenoxazine ring.

Amine repeat units may be provided in a molar amount in the range of about 0.5 mol % up to about 50 mol %, optionally about 1-25 mol %, optionally about 1-10 mol %.

The polymer may contain one, two or more different repeat units of formula (IX).

Amine repeat units may provide hole-transporting and/or light-emitting functionality. Preferred light-emitting amine repeat units include a blue light-emitting repeat unit of formula (IXa) and a green light-emitting repeat unit formula (IXb):

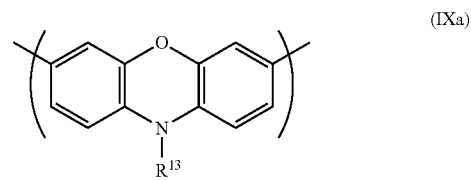

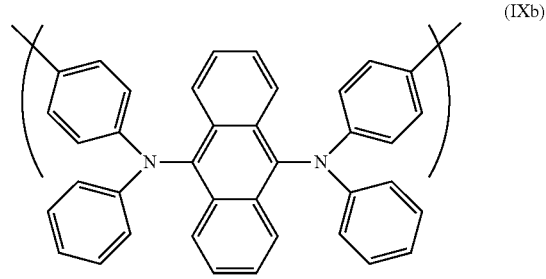

$R^{13}$ of formula (IXa) is preferably a hydrocarbyl, preferably $C_{1-20}$ alkyl, phenyl that is unsubstituted or substituted with one or more $C_{1-20}$ alkyl groups, or a branched or linear chain of phenyl groups wherein each said phenyl group is unsubstituted or substituted with one or more $C_{1-20}$ alkyl groups.

The repeat unit of formula (IXb) may be unsubstituted or one or more of the rings of the repeat unit of formula (IXb) may be substituted with one or more substituents $R^{15}$, preferably one or more $C_{1-20}$ alkyl groups.

A polymer comprising repeat units of formula (I) is preferably provided in a composition comprising the polymer and a phosphorescent material. The phosphorescent material is preferably a metal complex.

In one arrangement the phosphorescent material of the composition according to the invention is mixed with the polymer.

In another arrangement the phosphorescent material of the composition according to the invention is covalently bound to the polymer. In this arrangement, the phosphorescent material may be provided as a main-chain repeat unit of the polymer backbone, an end-group of the polymer or a side-group of the polymer that may be directly bound to the polymer backbone or spaced apart from the polymer backbone by a spacer group, for example a $C_{1-20}$ alkyl group.

Optionally, a photoluminescence spectrum of the phosphorescent material has a peak at a wavelength no more than 490 nm, optionally in the range of 420-575 nm, more preferably 420-480 nm.

Optionally, a light-emitting layer of an OLED according to the invention is formed by depositing a formulation according to the invention comprising the composition and at least one solvent, and evaporating the at least one solvent.

Polymers as described herein suitably have a polystyrene-equivalent number-average molecular weight (Mn) measured by gel permeation chromatography in the range of about $1 \times 10^3$ to $1 \times 10^8$, and preferably $1 \times 10^3$ to $5 \times 10^6$. The polystyrene-equivalent weight-average molecular weight (Mw) of the polymers described herein may be $1 \times 10^3$ to $1 \times 10^8$, and preferably $1 \times 10^4$ to $1 \times 10^7$.

Polymers described herein are suitably amorphous polymers.

Polymer Synthesis

One method of forming conjugated or partially conjugated polymers is Suzuki polymerisation, for example as described in WO 00/53656 or U.S. Pat. No. 5,777,070 which allows formation of C—C bonds between two aromatic or heteroaromatic groups, and so enables formation of polymers having conjugation extending across two or more repeat units. Suzuki polymerisation takes place in the presence of a palladium complex catalyst and a base.

As illustrated in Scheme 1, in the Suzuki polymerisation process a monomer for forming repeat units RU1 having leaving groups LG1 such as boronic acid or boronic ester groups undergoes polymerisation with a monomer for forming repeat units RU2 having leaving groups LG2 such as halogen, sulfonic acid or sulfonic ester to form a carbon-carbon bond between RU1 and RU2:

Scheme 1

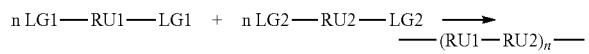

Exemplary boronic esters have formula (V):

wherein $R^6$ in each occurrence is independently a $C_1$-$C_{20}$ alkyl group, * represents the point of attachment of the boronic ester to an aromatic ring of the monomer, and the two groups $R^6$ may be linked to form a ring. In a preferred embodiment, the two groups $R^6$ are linked to form the pinacol ester of boronic acid:

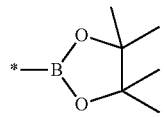

It will be understood by the skilled person that a monomer LG1-RU1-LG1 will not polymerise to form a direct carbon-carbon bond with another monomer LG1-RU1-LG1. A monomer LG2-RU2-LG2 will not polymerise to form a direct carbon-carbon bond with another monomer LG2-RU2-LG2.

Preferably, one of LG1 and LG2 is bromine or iodine and the other is a boronic acid or boronic ester.

This selectivity means that the ordering of repeat units in the polymer backbone can be controlled such that all or substantially all RU1 repeat units formed by polymerisation of LG1-RU1-LG1 are adjacent, on both sides, to RU2 repeat units.

In the example of Scheme 1 above, an AB copolymer is formed by copolymerisation of two monomers in a 1:1 ratio, however it will be appreciated that more than two or more than two monomers may be used in the polymerisation, and any ratio of monomers may be used.

The base may be an organic or inorganic base. Exemplary organic bases include tetra-alkylammonium hydroxides, carbonates and bicarbonates. Exemplary inorganic bases include metal (for example alkali or alkali earth) hydroxides, carbonates and bicarbonates.

The palladium complex catalyst may be a palladium (0) or palladium (II) compound.

Particularly preferred catalysts are tetrakis(triphenylphosphine)palladium (0) and palladium (II) acetate mixed with a phosphine.

A phosphine may be provided, either as a ligand of the palladium compound catalyst or as a separate compound added to the polymerisation mixture. Exemplary phosphines include triarylphosphines, for example triphenylphosphines wherein each phenyl may independently be unsubstituted or substituted with one or more substituents, for example one or more $C_{1-5}$ alkyl or $C_{1-5}$ alkoxy groups.

Particularly preferred are triphenylphospine and tris(ortho-methoxytriphenyl) phospine.

The polymerisation reaction may take place in a single organic liquid phase in which all components of the reaction mixture are soluble. The reaction may take place in a two-phase aqueous-organic system, in which case a phase transfer agent may be used. The reaction may take place in an emulsion formed by mixing a two-phase aqueous-organic system with an emulsifier.

The polymer may be end-capped by addition of an endcapping reactant. Suitable end-capping reactants are aromatic or heteroaromatic materials substituted with only one leaving group. The end-capping reactants may include reactants substituted with a halogen for reaction with a boronic acid or boronic ester group at a polymer chain end, and reactants substituted with a boronic acid or boronic ester for reaction with a halogen at a polymer chain end. Exemplary end-capping reactants are halobenzenes, for example bromobenzene, and phenylboronic acid. End-capping reactants may be added during or at the end of the polymerisation reaction.

Light-Emitting Layers

A light-emitting layer of an OLED may be unpatterned, or may be patterned to form discrete pixels. Each pixel may be further divided into subpixels. The light-emitting layer may contain a single light-emitting material, for example for a monochrome display or other monochrome device, or may contain materials emitting different colours, in particular red, green and blue light-emitting materials for a full-colour display.

A light-emitting layer may contain a mixture of more than one light-emitting material, for example a mixture of light-emitting materials that together provide white light emission. A white-emitting OLED may contain a single, white-emitting layer or may contain two or more layers that emit different colours which, in combination, produce white light. White light may be produced from a combination of red, green and blue light-emitting materials provided in a single light-emitting layer distributed within two or more light-emitting layers. In a preferred arrangement, the device has a light-emitting layer comprising a red light-emitting material and a light-emitting layer comprising green and blue light-emitting materials.

The light emitted from a white-emitting OLED may have CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-4500K.

Exemplary phosphorescent light-emitting materials include metal complexes comprising substituted or unsubstituted complexes of formula (X):

$$ML^1_q L^2_r L^3_s \quad (X)$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$. Each of $L^1$, $L^2$ and $L^3$ independently in each occurrence may be unsubstituted or substituted with one or more substituents. If q, r or s is greater than 1 then each occurrence of $L^1$, $L^2$ or $L^3$ respectively may be unsubstituted or substituted, and each occurrence of $L^1$, $L^2$ or $L^3$ respectively may be substituted with the same substituent or may be substituted with different sub stituents.

The metal complex of formula (X) may be homoleptic or heteroleptic.

For homoleptic complexes, q is preferably 2 or 3 and r and s are each 0. "Homoleptic complex" as used herein includes the case where r and s are both 0; q is at least 2; and substitution of at least two ligands $L^1$ is different.

For heteroleptic complexes q is 1 and at least one of r and s is at least 1. Optionally, q is 2, r is 1 and s is 0.

a, b and c are preferably each independently 1, 2 or 3. Preferably, each of a, b and c is 2.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands $L^1$, $L^2$ and $L^3$ include carbon or nitrogen donors such as porphyrin or bidentate ligands of formula (XI):

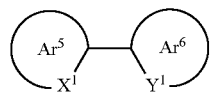

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together. Ligands wherein $X^1$ is carbon and $Y^1$ is nitrogen are preferred, in particular ligands in which $Ar^5$ is a single ring or fused heteroaromatic of N and C atoms only, for example pyridyl or isoquinoline, and $Ar^6$ is a single ring or fused aromatic, for example phenyl or naphthyl.

To achieve red emission, $Ar^5$ are selected from phenyl, fluorene, naphthyl. $Ar^6$ are selected from quinoline, isoquinoline, thiophene, benzothiophene.

To achieve green emission, $Ar^5$ are selected from phenyl or fluorene. $Ar^6$ are selected from pyridine.

To achieve blue emission, $Ar^5$ are selected from phenyl. $Ar^6$ are selected from imidazole, triazole, tetrazole.

Examples of bidentate ligands are illustrated below:

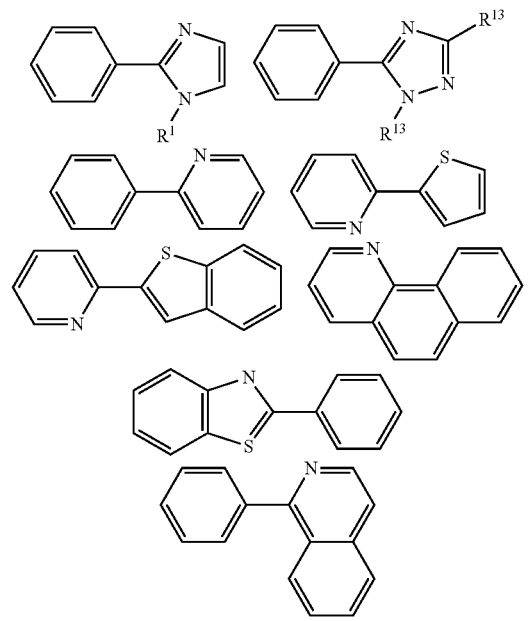

Each of $Ar^5$ and $Ar^6$ may carry one or more substituents. Two or more of these substituents may be linked to form a ring, for example an aromatic ring.

Other ligands suitable for use with d-block elements include diketonates, in particular acetylacetonate (acac); triarylphosphines and pyridine, each of which may be substituted.

Exemplary substituents include groups $R^{13}$ as described above with reference to Formula (IX). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy; charge-transporting groups, for example carbazole which may be used to assist hole transport to the complex when used as an emissive material, for example as disclosed in WO 02/81448; and dendrons which may be used to obtain or enhance solution processability of the metal complex, for example as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (XII)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (XIIa):

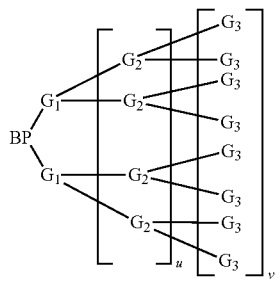

(XIIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each of BP and $G_1$, $G_2$ ... $G_n$ is phenyl, and each phenyl BP, $G_1$, $G_2$ ... $G_{n-1}$ is a 3,5-linked phenyl.

A preferred dendron is a substituted or unsubstituted dendron of formula (XIIb):

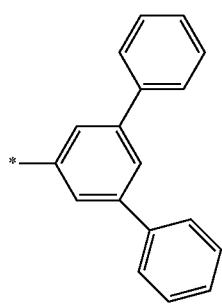

(XIIb)

wherein * represents an attachment point of the dendron to a core.

BP and/or any group G may be substituted with one or more substituents, for example one or more $C_{1-20}$ alkyl or alkoxy groups.

Phosphorescent light-emitting materials may be provided in a light-emitting layer with a host material. The host material may be a host polymer of the invention.

The phosphorescent light-emitting material may be physically mixed with the host polymer or may be covalently bound thereto. The phosphorescent light-emitting material may be provided in a side-chain, main chain or end-group of the polymer. Where the phosphorescent material is provided in a polymer side-chain, the phosphorescent material may be directly bound to the backbone of the polymer or spaced apart there from by a spacer group, for example a $C_{1-20}$ alkyl spacer group in which one or more non-adjacent C atoms may be replaced by O or S. It will therefore be appreciated that a composition of the present invention may consist of or may comprise a polymer of the invention comprising repeat units of formula (I) with a phosphorescent light-emitting material bound to the polymer.

In the case where one or more phosphorescent light-emitting materials are mixed with a host material, the phosphorescent light-emitting material(s) may make up about 0.05 wt % up to about 50 wt % of a host/phosphorescent light-emitting material composition.

In the case where one or more phosphorescent light-emitting materials are bound to a host material, for example a host polymer, the phosphorescent light-emitting material(s) may make up about 0.01-50 mol % of the material.

If more than two phosphorescent materials of different colours are used with a single host material then the emitter with the highest triplet energy level may be provided in a greater amount than the other emitter or emitters, for example in an amount of at least two times or at least 5 times the weight percentage of each of the other emitter or emitters.

Charge Transporting and Charge Blocking Layers

A hole transporting layer may be provided between the anode and the light-emitting layer or layers of an OLED. Likewise, an electron transporting layer may be provided between the cathode and the light-emitting layer or layers.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

A charge-transporting layer or charge-blocking layer may be cross-linked, particularly if a layer overlying that charge-transporting or charge-blocking layer is deposited from a solution. The crosslinkable group used for this crosslinking may be a crosslinkable group comprising a reactive double bond such and a vinyl or acrylate group, or a benzocyclobutane group.

If present, a hole transporting layer located between the anode and the light-emitting layers preferably has a HOMO level of less than or equal to 5.5 eV, more preferably around 4.8-5.5 eV or 5.1-5.3 eV as measured by cyclic voltammetry. The HOMO level of the hole transport layer may be selected so as to be within 0.2 eV, optionally within 0.1 eV, of an adjacent layer (such as a light-emitting layer) in order to provide a small barrier to hole transport between these layers.

If present, an electron transporting layer located between the light-emitting layers and cathode preferably has a LUMO level of around 2.5-3.5 eV as measured by cyclic voltammetry. For example, a layer of a silicon monoxide or silicon dioxide or other thin dielectric layer having thickness in the range of 0.2-2 nm may be provided between the light-emitting layer nearest the cathode and the cathode. HOMO and LUMO levels may be measured using cyclic voltammetry.

A hole transporting layer may contain a homopolymer or copolymer comprising a repeat unit of formula (IX) as described above, for example a copolymer comprising one or more amine repeat units of formula (IX) and one or more arylene repeat units, for example one or more arylene repeat units selected from formulae (VI), (VII) and (VIII).

An electron transporting layer may contain a polymer comprising a chain of optionally substituted arylene repeat units, such as a chain of fluorene repeat units.

If a hole- or electron-transporting layer is adjacent a light-emitting layer containing a phosphorescent material then the $T_1$ energy level of the material or materials of that layer are preferably higher than that of the phosphorescent emitter in the adjacent light-emitting layer.

Hole Injection Layers

A conductive hole injection layer, which may be formed from a conductive organic or inorganic material, may be provided between the anode 101 and the light-emitting layer 103 of an OLED as illustrated in FIG. 1 to assist hole injection from the anode into the layer or layers of semiconducting polymer. Examples of doped organic hole injection materials include optionally substituted, doped poly (ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

Cathode

The cathode 105 is selected from materials that have a workfunction allowing injection of electrons into the light-emitting layer of the OLED. Other factors influence the selection of the cathode such as the possibility of adverse interactions between the cathode and the light-emitting material. The cathode may consist of a single material such as a layer of aluminium. Alternatively, it may comprise a plurality of conductive materials such as metals, for example a bilayer of a low workfunction material and a high workfunction material such as calcium and aluminium, for example as disclosed in WO 98/10621. The cathode may comprise elemental barium, for example as disclosed in WO 98/57381, Appl. Phys. Lett. 2002, 81(4), 634 and WO 02/84759. The cathode may comprise a thin (e.g. 0.5-5 nm) layer of metal compound, in particular an oxide or fluoride of an alkali or alkali earth metal, between the organic layers of the device and one or more conductive cathode layers to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

A formulation suitable for forming a charge-transporting or light-emitting layer may be formed from the composition or the polymer of the invention, any further components of the layer such as light-emitting dopants, and one or more suitable solvents.

The formulation may be a solution of the composition or the polymer and any other components in the one or more solvents, or may be a dispersion in the one or more solvents in which one or more components are not dissolved. Preferably, the formulation is a solution.

Solvents suitable for dissolving semiconducting polymers, particularly polymers comprising alkyl substituents, include benzenes substituted with one or more $C_{1-10}$ alkyl or $C_{1-10}$ alkoxy groups, for example toluene, xylenes and methylanisoles.

Particularly preferred solution deposition techniques including printing and coating techniques such spin-coating and inkjet printing.

Spin-coating is particularly suitable for devices wherein patterning of the light-emitting layer is unnecessary—for example for lighting applications or simple monochrome segmented displays.

Inkjet printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, roll printing, screen printing and slot-die coating.

Examples

Polymers were prepared by Suzuki polymerisation as described in WO 00/53656 of monomers illustrated below in the amounts shown in Table 1.

Monomer Example 1

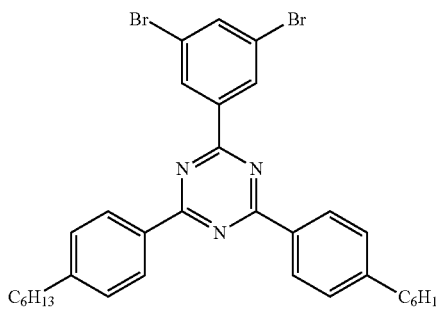

Comparative Monomer 1

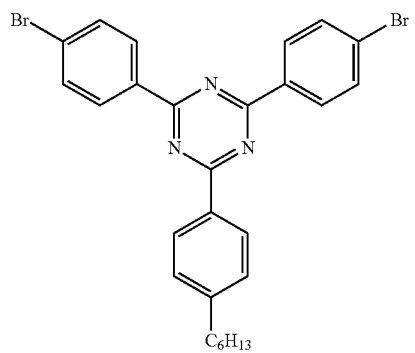

Comparative Monomer 2

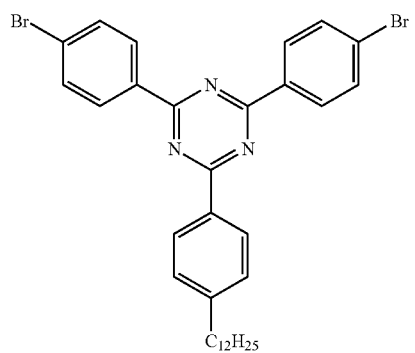

Monomer A

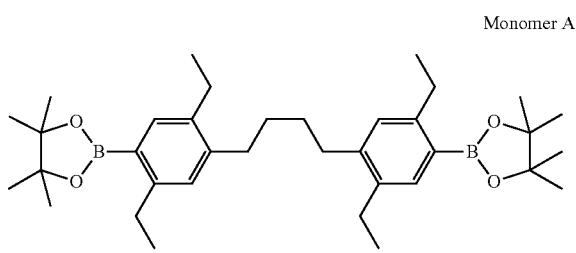

Monomer B

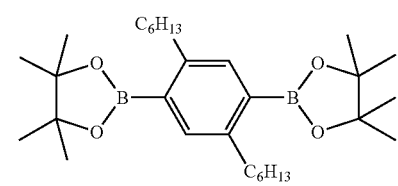

Monomer C

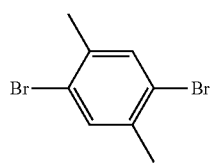

Lowest excited triplet state ($T^1$) energy levels of the polymers were measured by time-resolved photoluminescence spectroscopy.

TABLE 1

| Polymer | Boronic ester monomer (mol %) | Dibromo monomer (mol %) | $T_1$ level (eV) |
| --- | --- | --- | --- |
| Comparative Polymer 1 | Monomer B (50) | Comparative Monomer 1 (50) | 2.55 |
| Comparative Polymer 2 | Monomer B (50) | Monomer Example 1 (50) | 2.68 |

The conjugated polymer Comparative Polymer 1 has a relatively low triplet energy level as compared to Comparative Polymer 2, demonstrating the increase in triplet energy level achieved on replacing Comparative Monomer 1 with Monomer Example 1.

COMPOSITION EXAMPLES

Polymer Example 2 and Comparative Polymer 2 were prepared by Suzuki polymerisation as described in WO 00/53656 of monomers in the amounts set out in Table 2.

A film of a composition of Polymer Example 2 or Comparative Polymer 2: Phosphorescent Blue Emitter 1 (95:5 wt %) was prepared by spin-coating a solution of the composition.

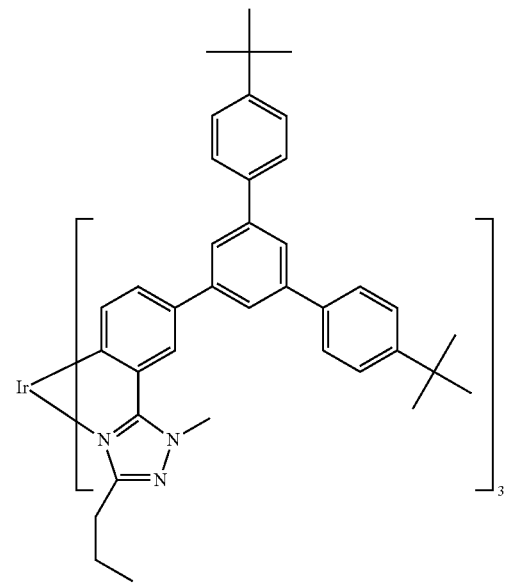

Phosphorescent Blue Emitter 1

Photoluminescent quantum yield (PLQY) of the composition was measured using an integrating sphere, Hamamatsu Model C9920-02.

For each sample the film was spun on a quartz substrate and placed in the integrating sphere. The sample was scanned with wavelengths 280 nm-350 nm approx and wavelength where the emission peak is the most intense was selected. A blank spectrum was measured at the chosen wavelength followed by measurement of the sample.

TABLE 2

| Polymer | Boronic ester monomer (mol %) | Dibromo monomer (mol %) | PLQY (%) |
|---|---|---|---|
| Polymer Example 2 | Monomer A (50) | Monomer Example 1 (25) Monomer C (25) | 71.4 |
| Comparative Polymer 2 | Monomer A (50) | Comparative Monomer 2 (25) Monomer C (25) | 63.1 |

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A co-polymer comprising a repeat unit of formula (I):

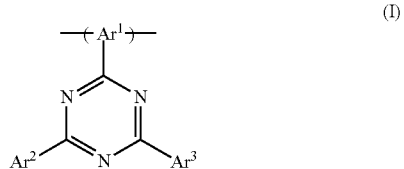

(I)

wherein $Ar^1$, $Ar^2$ and $Ar^3$ each independently represent an aryl or heteroaryl group that may be unsubstituted or substituted with one or more substituents, the copolymer further comprising a conjugation-breaking repeat unit of formula (II) that does not provide any conjugation path between repeat units adjacent to the conjugation-breaking repeat unit,

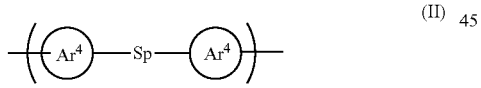

(II)

wherein:
$Ar^4$ in each occurrence independently represent an aryl or heteroaryl group that may be unsubstituted or substituted with one or more substituents; and
Sp represents a spacer group comprising at least one carbon or silicon atom.

2. A polymer according to claim 1 wherein $Ar^1$ is phenylene.

3. A polymer according to claim 2 wherein $Ar^1$ is 1,3-linked phenylene.

4. A polymer according to claim 1 wherein $Ar^2$ is phenyl.

5. A polymer according to claim 1 wherein $Ar^3$ is phenyl.

6. A composition comprising a polymer according to claim 1 and a light-emitting material.

7. A composition according to claim 6 wherein the light-emitting material is mixed with the polymer.

8. A composition according to claim 6 wherein the light-emitting material is covalently bound to the polymer.

9. A composition according to claim 6 wherein the light-emitting material is a phosphorescent material.

10. A composition according to claim 9 wherein the phosphorescent material has a photoluminescent spectrum with a peak in the range of 420-490 nm.

11. A formulation comprising a polymer according to claim 1 or a composition according to claim 6 and at least one solvent.

12. An organic light-emitting device comprising an anode, a cathode and a light-emitting layer between the anode and cathode wherein the light-emitting layer comprises a composition according to claim 6.

13. A method of forming a polymer according to claim 1 comprising the step of polymerising a monomer of formula (IV):

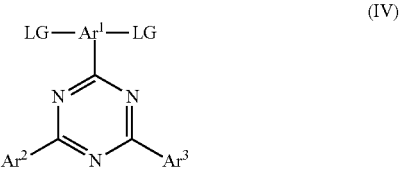

(IV)

wherein LG is a leaving group capable of leaving in a coupling reaction to form a carbon-carbon bond with an aromatic or heteroaromatic group; $Ar^1$, $Ar^2$ and $Ar^3$ each independently represent an aryl or heteroaryl group that may be unsubstituted or substituted with one or more substituents; and wherein the monomer of formula (IV) is copolymerized with a monomer for forming the conjugation-breaking repeat unit of formula (II).

14. A method according to claim 13, wherein each LG is independently selected from the group consisting of halogens; boronic acids; boronic esters; sulfonic acids; and sulfonic esters.

15. A method according to claim 14 wherein the halogens are bromine or iodine.

16. A method according to claim 14 wherein the polymerisation is carried out in the presence of a metal catalyst.

17. The polymer of claim 1 further comprising a phenylene repeat unit of formula (VI):

(VI)

wherein:
w in each occurrence is independently 0, 1, 2, 3 or 4;
n is 1, 2 or 3; and
$R^7$ independently in each occurrence is a substituent.

* * * * *